United States Patent
Shizuno et al.

(10) Patent No.: US 6,852,617 B2
(45) Date of Patent: Feb. 8, 2005

(54) SEMICONDUCTOR DEVICE FABRICATION METHOD

(75) Inventors: Yoshinori Shizuno, Kanagawa (JP); Takashi Ohsumi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/771,393

(22) Filed: Feb. 5, 2004

(65) Prior Publication Data

US 2004/0175914 A1 Sep. 9, 2004

(30) Foreign Application Priority Data

Jun. 3, 2003 (JP) ........................................ 2003-158380

(51) Int. Cl.[7] .............................................. H01L 21/44
(52) U.S. Cl. ...................... 438/613; 438/609; 438/689; 438/691; 438/694; 257/737; 257/738
(58) Field of Search ................................ 438/609, 613, 438/618, 622, 689, 690, 691, 692, 694, 695; 257/737–738

(56) References Cited

U.S. PATENT DOCUMENTS

| | | | | |
|---|---|---|---|---|
| 5,895,231 A | * | 4/1999 | Choi et al. ................... | 438/106 |
| 6,329,251 B1 | * | 12/2001 | Wu .............................. | 438/275 |
| 6,501,169 B1 | * | 12/2002 | Aoki et al. .................. | 257/700 |
| 6,770,971 B2 | * | 8/2004 | Kouno et al. ................ | 257/734 |
| 2001/0008309 A1 | * | 7/2001 | Iijima et al. ................. | 257/737 |
| 2003/0096495 A1 | * | 5/2003 | Ihara et al. .................. | 438/614 |

FOREIGN PATENT DOCUMENTS

JP    2000-353766    12/2000

* cited by examiner

*Primary Examiner*—Amir Zarabian
*Assistant Examiner*—Thanh Y. Tran
(74) *Attorney, Agent, or Firm*—Rabin & Berdo, P.C.

(57) ABSTRACT

In one embodiment of the invention, a plurality of posts (terminals) stands on a main surface of a semiconductor substrate. A first metal electrode is formed on a side face of each post before providing a sealing layer over the main surface of the semiconductor substrate. The first metal electrode constitutes a portion of an external terminal. After providing the sealing layer, a second metal electrode is formed on each post and the associated first metal electrode. Then, an "alloy" of the first and second metal electrodes is formed by heating these electrodes. Accordingly, the external terminal can be formed on the top face and side face of each post without carrying out a step of removing the sealing layer by means of a laser.

26 Claims, 7 Drawing Sheets

SEMICONDUCTOR DEVICE FABRICATION METHOD

BACKGROUND OF THE INVENTION

1. Field of the Invention

The present invention relates to a method for fabricating a semiconductor device and, more particularly, to a method for fabricating a semiconductor device that affords a highly reliable connection to an external substrate.

2. Description of the Related Art

In recent years, in keeping with the miniaturization of semiconductor devices, a semiconductor device package structure known as a Chip Size Package (hereinafter referred to as a 'CSP') the outer dimensions of which are substantially the same as the outer dimensions of the semiconductor chip has emerged. One form of CSP is a semiconductor device package structure known as a Wafer Level Chip Size Package (hereinafter referred to as a 'WCSP') in which packaging is performed in a wafer state.

A semiconductor device having this WCSP structure will be described below.

In a conventional WCSP structure semiconductor device, electrodes are formed on a semiconductor chip on which an integrated circuit is already formed. An insulation film is formed on the semiconductor chip so that the top faces (upper surfaces) of the electrodes are exposed. The insulation film has a plurality of openings and the top faces of the electrodes are exposed by these openings.

Wiring and terminals known as posts are formed on the insulation film. Normally, this wiring is known as rewiring or relocated wiring, and one end of the wiring is connected to the electrodes via the openings in the insulation film, while the other end is connected to the posts.

In addition, the top side of the semiconductor device is sealed by means of a sealing material such as resin so that the top faces of the posts are exposed, and an external terminal such as a solder ball is formed on the top face of each of the exposed posts.

This WCSP structure packaging is undertaken in a wafer state. Wafers are cut and divided up after being sealed, whereby many CSP-structure semiconductor chips are produced.

However, if a temperature change or similar is applied after the WCSP-structure semiconductor device has been mounted on an external substrate or the like, stress acts on the external terminals because the thermal expansion rate of the semiconductor device is greatly different from the thermal expansion rate of the external substrate. As a result, there may be concentration of stress at the join between the top face of the posts and the external terminals, and cracks will be generated at the join.

In addition, if a semiconductor device is mounted in a portable device such as a cellular phone, and the semiconductor device is carried round, the semiconductor device is often subjected to the collisions and vibrations and stress acts on the external terminals. Thus, there is the possibility that there will be a concentration of stress at the join between the top face of the post and the associated external terminal. This concentration of the stress cracks the joint.

As a result, there is the possibility that the joining forces between the posts and the external terminals will drop and that there will be a large reduction in the reliability of the connection between the semiconductor device and the external substrate.

A technology that is intended to resolve this problem is disclosed in, for example, Japanese Patent Application Kokai (Laid Open Publication) No. 2000-353766. This involves exposing the side of each post by removing the sealing material on the circumference of each post by irradiating the sealing material with a laser, and then forming an external terminal on the side of the exposed post and on the top face of the post.

In the connection structure disclosed in Japanese Patent Application Kokai No. 2000-353766, the stress acting on each external terminal can be dispersed at the side and top face of the associated post, whereby the possibility of a concentration of stress at the join between the top face of the post and the associated external terminal can be reduced-and hence the reliability of the connection between the semiconductor device and the external substrate can be raised.

However, with the technology disclosed in Japanese Patent Application Kokai No. 2000-353766, because the step of removing the sealing layer from the circumference of each of the posts by means of a laser takes an extremely long time, the package fabrication time increases and a drop in production efficiency occurs.

SUMMARY OF THE INVENTION

An object of the present invention is to provide a semiconductor device fabrication method that makes it possible to form an external terminal on the side and top face of each post without carrying out a step of removing the sealing layer by means of a laser.

According to one aspect of the present invention, there is provided a semiconductor device fabrication method that includes preparing a semiconductor substrate having a plurality of terminals formed on a main surface of the semiconductor substrate, and forming a first metal electrode on a side face of each terminal. The fabrication method also includes forming a sealing layer on the main surface of the semiconductor substrate so as to cover the terminals and the first metal electrodes. The fabrication method also includes exposing a top face of each terminal and a top face of each first metal electrode by polishing a surface of the sealing layer. The fabrication method also includes forming a second metal electrode on the exposed top face of each terminal and on the exposed top face of each first metal electrode. The fabrication method also includes producing an "alloy" of each first metal electrode and associated second metal electrode by heating the first and second metal electrodes. This "alloy" becomes an external terminal.

The external terminal can be formed on the side and top faces of each post within a short time, and the reliability of the connection between the semiconductor device and the external substrate is increased.

According to a second aspect of the present invention, there is provided a semiconductor device fabrication method that includes preparing a semiconductor substrate having a plurality of terminals formed on a main surface of the semiconductor substrate, and covering a side face of each terminal with a dummy layer. The fabrication method also includes forming a sealing layer on the main surface of the semiconductor substrate so as to cover the terminals and the dummy layers. The fabrication method also includes exposing a top face of each terminal and a top face of each dummy layer by polishing a surface of the sealing layer. The fabrication method also includes exposing the side face of each terminal by removing the dummy layer. The fabrication method also includes forming a conductor on the exposed surface of each terminal. The conductor is used as an external terminal.

Provision of the external terminal on the side and top faces of the post (i.e., terminal) can be implemented within a short time, and the reliability of the connection between the semiconductor device and the external substrate is increased.

Other objects, aspects and advantages of the present invention will become apparent to those skilled in the art to which the present invention pertains from the subsequent detailed description and appended claims, when read and understood in conjunction with the accompanying drawings.

DETAILED DESCRIPTION OF THE INVENTION

Embodiments of the present invention will be described in detail below with reference to the drawings. Similar reference symbols are assigned to similar parts and elements throughout the drawings.

First Embodiment

FIGS. 1 to 6 illustrate the semiconductor device fabrication method according to the first embodiment of the present invention.

Figure 1:
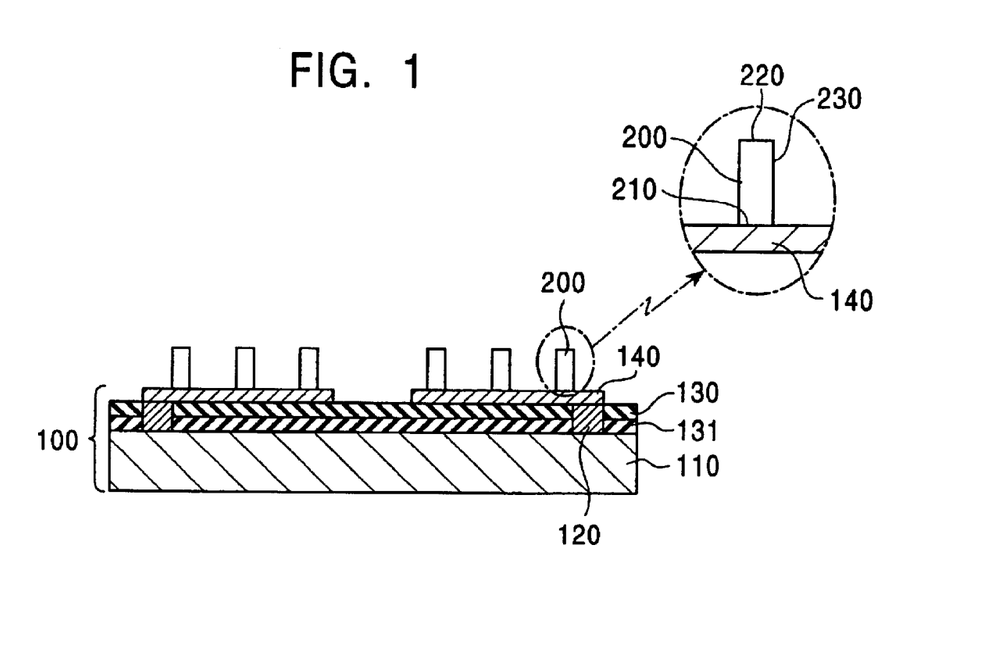
FIG. 1 is a cross-sectional view showing the step of preparing a semiconductor substrate on which a plurality of terminals is formed, according to a first embodiment of the present invention.

As shown in FIG. 1, in the semiconductor device fabrication method according to this embodiment, first of all, a plurality of terminals (occasionally referred to as "terminal group") 200 is formed on the main surface of a semiconductor substrate 100.

Here, the semiconductor substrate 100 is a substrate that includes a semiconductor wafer 110, electrodes 120, an insulation film 130, and wiring 140 formed on the main surface of the semiconductor wafer 110.

In this embodiment, the electrodes 120 made of Al (aluminum) or the like are formed on the semiconductor wafer 110 made of Si (silicon) or the like. The semiconductor wafer 110 has an integrated circuit (not shown) formed on the main surface thereof. The electrodes 120 are electrically connected to the integrated circuit.

A protective film 131 such as a nitride film (SiN (silicon nitride) film, for example) is formed on the semiconductor wafer 110 such that the top face of each electrode 120 is exposed. The insulation film 130 made from polyimide or the like is formed on the protective film 131 such that the top face of each electrode 120 is still exposed.

The protective film 131 is formed with a thickness of approximately 1 $\mu$m by means of CVD (Chemical Vapor Deposition) or similar. The source gases for the CVD are silane and ammonia, for example. The insulation film 130 is formed with a thickness of approximately 2 to 10 $\mu$m by spin coating and heat-processing a varnish that is produced by dissolving polyimide or a precursor thereof in a solvent, for example.

The wiring 140 made of Cu (copper) or similar and the terminals 200 known as "posts" and made of Cu or the like are formed on the insulation film 130.

The wiring 140 is formed by metal vapor deposition through sputtering, photolithography, plating, or other methods. The terminals 200 are provided by forming a resist layer up to the height of the terminals 200 and then performing photolithography, plating or other methods.

The terminal group 200 electrically connects the wiring 140 to the external terminals that are connected to an external substrate and so forth. Each terminal 200 includes a first face 210 that is in contact with the main surface of the semiconductor substrate 100, an opposite face (second face) 220 that is parallel to the first face 210, and a side face (lateral wall) 230 extending between the first face 210 and the second face 220.

The interval between each tow adjacent terminals 200 is approximately 150 $\mu$m to 400 $\mu$m, and the height of the terminal 200 is approximately 100 $\mu$m. The terminal 200 has a cylindrical shape and the diameter of the terminal 200 is approximately 150 $\mu$m to 400 $\mu$m.

One end of the wiring 140 is connected to the electrodes 120, while the other end of the wiring 140 is connected to the terminals 200.

The point at which the semiconductor device is electrically connected to the external substrate or similar can be set in an arbitrary position because the wiring 140 is provided in this embodiment. Generally, this arbitrary placement of the connecting point between the semiconductor device and external substrate is known as relocation, and hence the wiring 140 is called the relocation wiring or rewiring.

Figure 2:
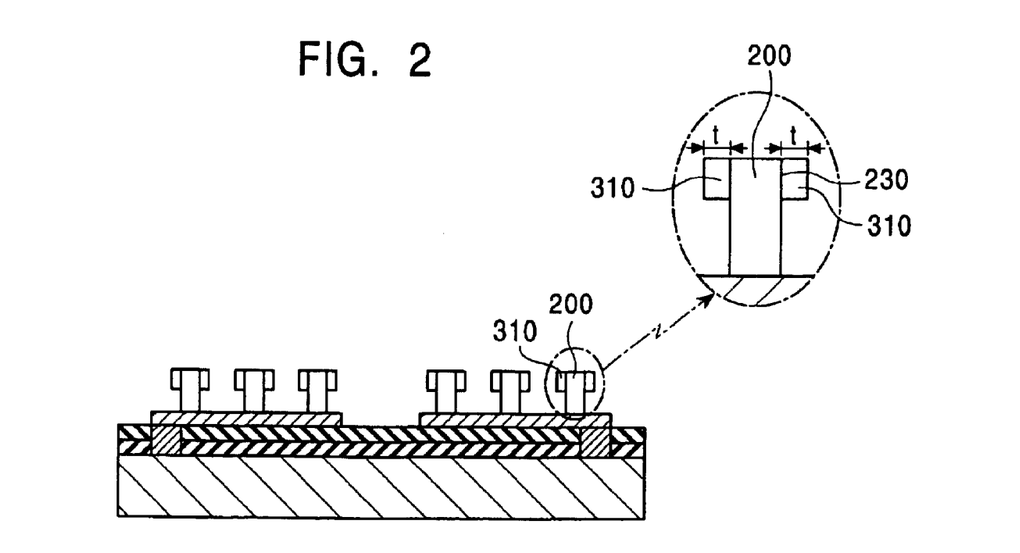
FIG. 2 is a cross-sectional view that shows the step of forming a first metal electrode on each terminal, according to the first embodiment.

Next, a metal electrode 310 that is made of solder or similar is formed on the side face 230 of each terminal 200 as shown in FIG. 2.

Figure 3:
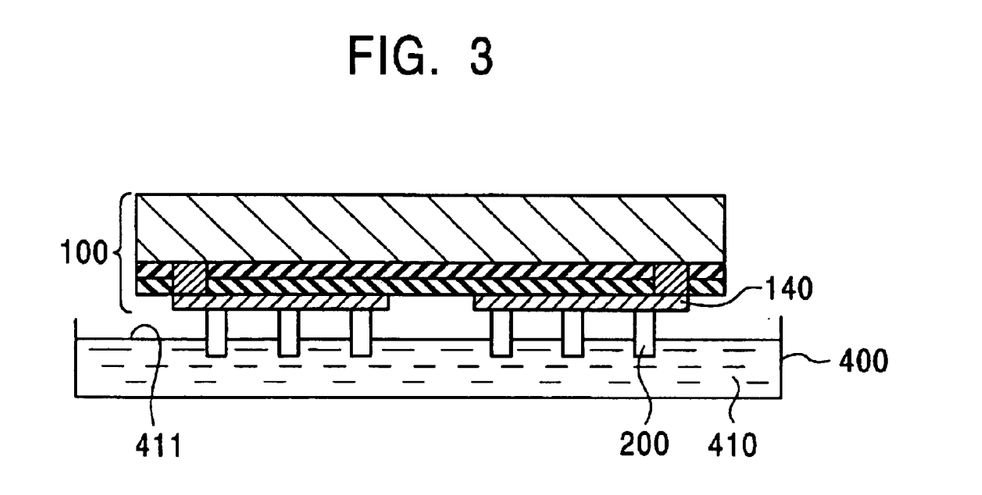
FIG. 3 is a cross-sectional view that shows the step of immersing the terminals in a molten metal bath, according to the first embodiment.

As shown in FIG. 3, in this embodiment, the metal electrode 310 is formed so as to surround the side 230 of each of the terminals 200 by immersing the terminals 200 in a molten metal bath 400 that contains a molten metal 410 such as molten solder.

The adjacent metal electrodes 310 that are formed on the adjacent terminals 200 are spaced apart at a predetermined interval. As shown in FIG. 2, the film thickness t of the metal electrode 310 is preferably at least 10 $\mu$m in order to obtain sufficient strength with respect to the supposed external stress. The film thickness t of the metal electrode 310 can be controlled to a desired value by adjusting the time interval during which the terminals 200 are immersed in the molten metal bath 400, the temperature of the molten metal 410, and/or other factors.

When the terminals 200 are immersed in the metal bath 400, the main surface of the semiconductor substrate 100 and the liquid surface 411 of the molten metal 410 face each other and are parallel to each other. It should be noted that when the terminals 200 are immersed in the metal bath 400, the metal 410 may stick to the second faces 220 of the terminals 200.

Accordingly, the metal electrodes 310 can be simultaneously formed over the respective terminals 200 provided on the semiconductor substrate 100, and the metal electrodes 310 can be formed on the terminals 200 without a marked increase in the manufacturing steps.

The terminals 200 are immersed in the metal bath 400 such that the main surface of the semiconductor substrate 100 and the liquid surface 411 of the molten metal 410 are spaced apart at a predetermined interval.

Accordingly, the possibility that the molten metal 410 will stick to the wiring 140 formed on the semiconductor substrate 100 can be diminished.

If the adhesion of the metal electrodes 310 with a sealing layer 600 that is formed so as to cover the terminals 200 in a subsequent step is lower than the adhesion of the terminals 200 with the sealing layer 600 (e.g., when the material of the metal electrodes 310 is solder and the material of the terminals 200 is Cu), the sides 230 of the terminals 200 must be exposed over a predetermined range in order to increase the adhesion with the sealing layer 600. For this reason, when the terminals 200 are immersed in the metal bath 400, the main surface of the semiconductor substrate 100 and the liquid surface of the molten metal 410 are preferably at least 20 $\mu$m apart.

Figure 4:
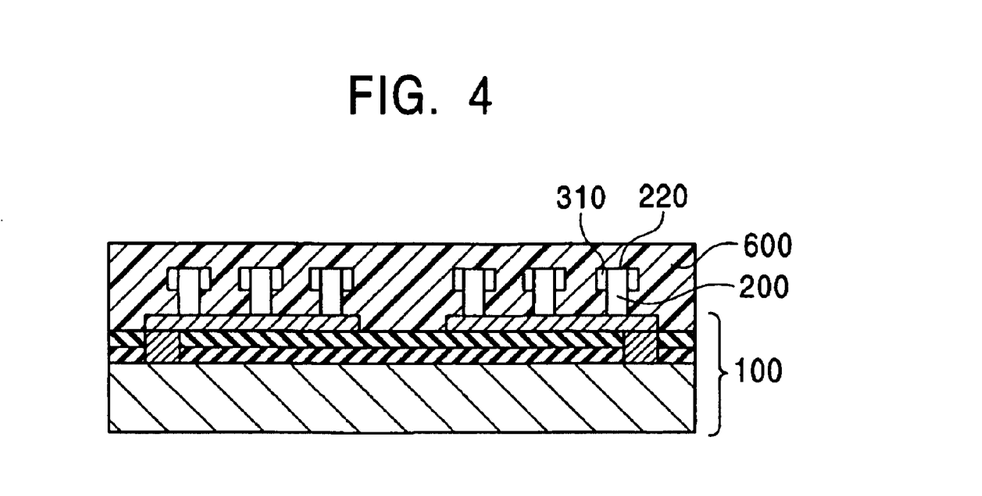
FIG. 4 is a cross-sectional view that shows the step of forming a sealing layer on the main surface of the semiconductor substrate, according to the first embodiment.

After the terminals 200 are lifted up from the metal bath 400, the sealing layer 600 that is made of epoxy resin or the like is formed on the main surface of the semiconductor substrate 100 such that the terminals 200 and the metal electrodes 310 are covered by the sealing layer 600, as shown in FIG. 4.

Accordingly, the main surface of the semiconductor substrate 100 and the sides of the terminals 200 can be protected from moisture and so forth.

In this embodiment, the sealing layer 600 is formed by supplying resin to the semiconductor substrate 100 that is disposed in a mold and then applying pressure. At such time, because the semiconductor substrate 100 is disposed such that the top faces of the terminals 200 (i.e., the second faces 220) are spaced apart from the mold, the resin is also supplied between the second faces 220 and the mold, and the sealing layer 600 is formed so as to cover the second faces 220.

During the sealing process, therefore, the terminals 200 and the mold are not in contact with one another, so that the possibility that the terminals 200 are damaged as a result of the terminals 200 being pressed by the mold is reduced.

Moreover, in this embodiment, an oxide film is formed on the surfaces of the terminals 200 made of Cu before the sealing layer 600 is formed. The oxide film is a copper oxide film, for example, and is formed by subjecting the terminals 200 to a heat treatment in air or in an oxygen atmosphere.

As a result, the adhesion between the terminals 200 and the sealing layer 600 can be enhanced. This enhancement primarily relies upon the hydrogen bond between the oxide film and the resin.

Therefore, the possibility that humidity and so forth will penetrate the integrated circuit via the interface between the terminals 200 and the sealing layer 600 is diminished.

Figure 5:
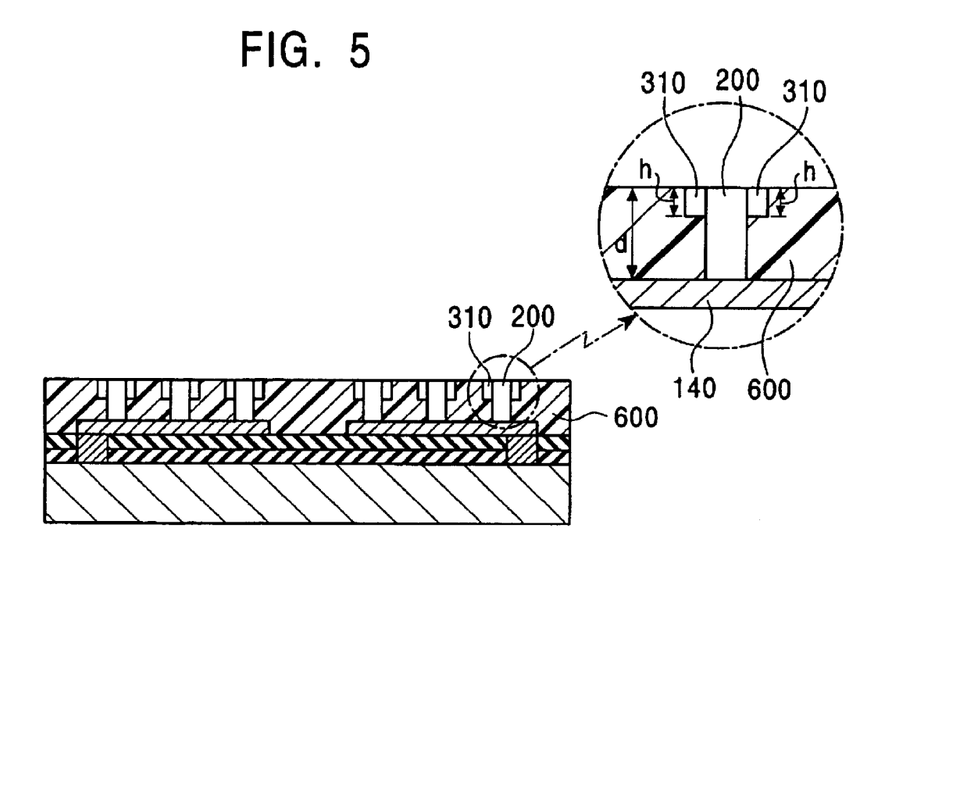
FIG. 5 is a cross-sectional view that shows the step of exposing the terminals and the first metal electrodes by polishing the surface of the sealing layer, according to the first embodiment.

Next, as shown in FIG. 5, the top faces of the terminals 200 and the top faces of the metal electrodes 310 are exposed by polishing the surface of the sealing layer 600.

As a result of this polishing, the top face of the semiconductor device is made smooth and the respective height of the terminals 200 is afforded a predetermined value.

Accordingly, inconsistencies in the height of the external terminals formed on the terminal 200 can be reduced and the reliability of the connection between the external terminal and the external substrate can be increased when mounting the semiconductor substrate 100 on the external substrate.

In this embodiment, the top faces of the terminals 200, the top faces of the metal electrodes 310 and the top face of the sealing layer 600 become substantially planar with each other as a result of this polishing.

The height d of the polished terminal 200 is preferably at least 40 $\mu$m in order to alleviate the influences of the stress that is generated as a result of the difference between the thermal expansion rate of the semiconductor substrate 100 and the thermal expansion rate of the external substrate. In addition, the height h of the metal electrode 310 is preferably at least 10 $\mu$m in order to obtain sufficient strength with respect to the supposed external stress.

In order to render the height h of the metal electrode 310 equal to or more than 10 $\mu$m, the terminals 200 are preferably immersed to a depth, which is incremented by an additional amount, in the above-mentioned step of immersing the terminals 200 in the metal bath 400. The "additional amount" is added because each metal electrode 310 is made shorter by the smoothing polishing process. Therefore, the terminals 200 are preferably immersed to a depth of at least 10 $\mu$m plus some additional distance.

Figure 6:
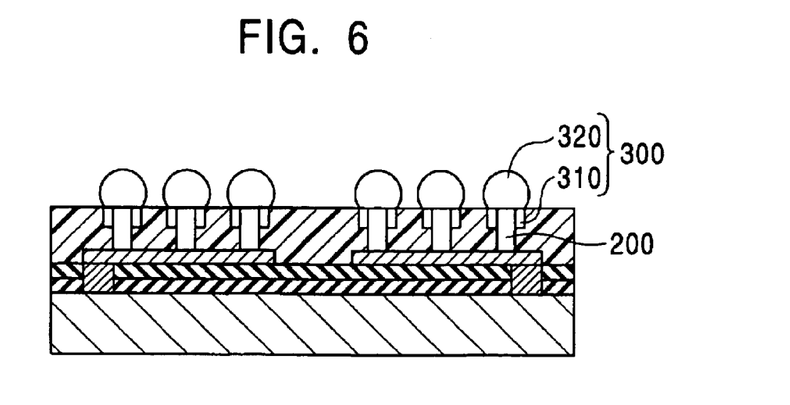
FIG. 6 is a cross-sectional view that shows the step of forming a second metal electrode on each first metal electrode and on each terminal, according to the first embodiment.

Next, as shown in FIG. 6, a metal electrode 320 made of solder or the like is formed on the top face of each terminal 200 and the top face of the associated metal electrode 310 which are exposed by polishing. An "alloy" of the metal electrode 310 and the metal electrode 320 is produced by heating these electrodes 310 and 320. Here, "alloy" denotes a state where the metal electrode 310 and the metal electrode 320 are melted by means of a heat treatment so as to blend with each other. Thus, the metal electrode 310 and the metal electrode 320 are integrated by being melted. The metal electrode 310 and metal electrode 320 may be made of the same or a different material, as long as the materials can be integrated by being melted by means of a heat treatment.

When solder is used for the material of the metal electrode 310 and the metal electrode 320, the heat produced during the formation of the metal electrode 320 or the heat produced during the mounting of the semiconductor device (or the substrate 100) on the external substrate melts the metal electrode 310, so that the metal electrode 310 and metal electrode 320 blend with each other after melting. Therefore, the present embodiment can be implemented without performing a new, additional heating step.

As described above, by melting the metal electrode 310 and metal electrode 320 to form an alloy, an external terminal 300 that links and covers the top face and side of the terminal 200 is formed.

Accordingly, the stress acting on each external terminal 300 is dispersed, not only to the join between the top face of the terminal 200 and the associated external terminal 300, but also to the join between the side 230 of the terminal 200 and the associated external terminal 300. Therefore, the possibility of a concentration of stress at the join between the top face of the terminal 200 and the external terminal 300 and hence the occurrence of cracks and so forth is reduced, and the reliability of the connection between the semiconductor device and external substrate can be increased.

In particular, sufficient strength is achieved against the stress from the transverse direction of the semiconductor device. This is because the external terminal 300 is formed so as to cover the side 230 of the terminal 200, and the external terminal 300 is suspended on the terminal 200 when the stress acts in the transverse direction of the semiconductor device.

If the semiconductor device is mounted in a portable device such as a cellular phone, large stress often acts from the transverse direction of the semiconductor device due to the collisions and vibrations that occur when the portable device is carried around.

The adverse effects of this stress can be reduced if the present embodiment is applied to such a semiconductor device. Thus, the present embodiment can improve the reliability of the connection between the semiconductor device and the external substrate and consequently improve the reliability of the semiconductor device.

In this embodiment, the material of the metal electrode 310 is solder and the material of the metal electrode 320 is also solder, and the metal electrode 310 and metal electrode 320 melt and are joined as a result of the heat produced when the metal electrode 320 is mounted on the terminal 200. The temperature of the heat applied at this time is about 210 to 260° C.

In this embodiment, as shown in FIG. 6, the external terminal 300 made of solder (i.e., the solder ball) that connects the associated terminal 200 and the external substrate, is formed so as to cover the top face and side of the associated terminal 200.

Thereafter, the sealed semiconductor substrate 100 is cut by means of a diamond blade or the like to render separate semiconductor chips.

Therefore, in this embodiment, the metal electrode 310 constituting part of the external terminal 300 is formed on the side 230 of each terminal 200 before the sealing layer 600 is formed.

Accordingly, the step in which the side 230 of each terminal 200 is exposed via the sealing layer by removing part of the sealing layer 600 by means of a laser in order to form the external terminal 300 on the side 230 of the terminal 200 is not performed. Without such step, the external terminal 300 can be formed on the top face and the side 230 of each terminal 200 in this embodiment, and therefore the production efficiency can be raised by shortening the package fabrication time in this embodiment.

Second Embodiment

Next, the semiconductor device fabrication method according to the second embodiment of the present invention will be described.

FIGS. 7 to 12 are a series of cross-sectional views that illustrate the semiconductor device fabrication method according to the second embodiment of the present invention.

Figure 7:
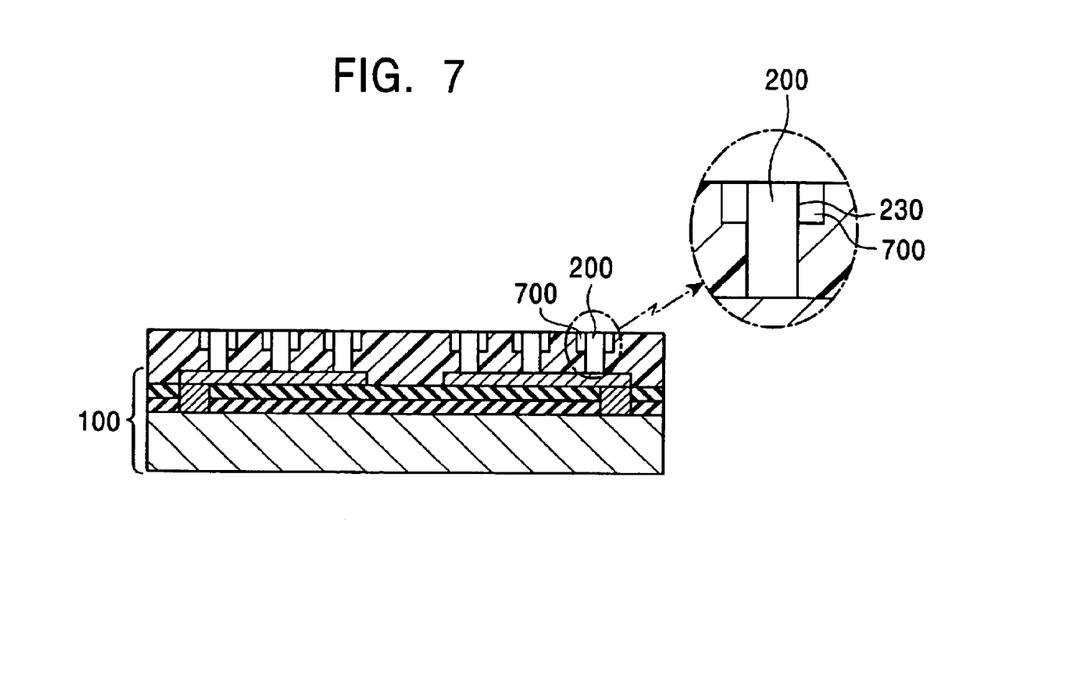
FIG. 7 is a cross-sectional view that shows the step of forming a dummy layer on each terminal, according to a second embodiment of the present invention.

As shown in FIG. 7, the semiconductor device fabrication method of this embodiment involves, first, forming a dummy layer 700 made of a resin or the like on the side 230 of each of the terminals 200 that are formed on the semiconductor substrate 100.

The dummy layer 700 controls the sealing of the side 230 of the terminal 200 by the sealing layer 600. The dummy layer 700 is resistant to the heat of the sealing step and is soluble in organic solvents, alkaline solvents or the like.

When a low temperature curing-type liquid resin is used as the material of the sealing layer 600, a photoresist or similar can be used as the material of the dummy layer 700.

When a mold resin is used as the material of the sealing layer 600, polyimide or similar can be used as the material of the dummy layer 700.

In this embodiment, the dummy layer 700 is formed so as to surround the side (lateral wall) 230 of the terminal 200.

The adjacent dummy layers 700 formed on the adjacent terminals 200 are spaced apart at predetermined intervals.

Figure 8:
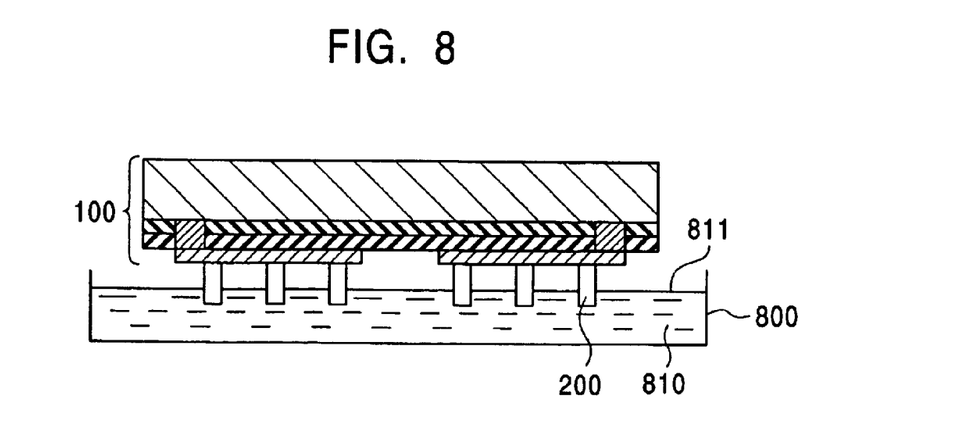
FIG. 8 is a cross-sectional view that shows the step of immersing the terminals in a resin bath, according to the second embodiment.

As shown in FIG. 8, the dummy layers 700 are formed by immersing the terminals 200 in a resin bath 800 that contains a molten resin 810. Here, the dummy layer 700 is formed with a film thickness that is at least 10 $\mu$m. The film thickness of the dummy layer 700 can be controlled by adjusting the viscosity of the molten resin 810.

When the terminals 200 are immersed in the resin bath 800, the main surface of the semiconductor substrate 100 and the liquid surface 811 of the molten resin 810 face each other and are parallel to each other.

Accordingly, the dummy layers 700 can be simultaneously created on the terminals 200 formed on the semiconductor substrate 100. Thus, the dummy layers 700 can be formed on the terminals 200 without significantly increasing the manufacturing steps.

The terminals 200 are immersed in the resin bath 800 such that the main surface of the semiconductor substrate 100 is spaced from the liquid surface 811 of the molten resin 810 at a predetermined interval. The main surface of the semiconductor substrate 100 and the liquid surface 811 are preferably spaced apart by at least 20 $\mu$m.

Thereafter, the terminals 200 are lifted up from the resin bath 800 and the dummy layers 700 formed on the sides 230 of the terminals 200 are cured by means of a heat treatment.

Figure 9:
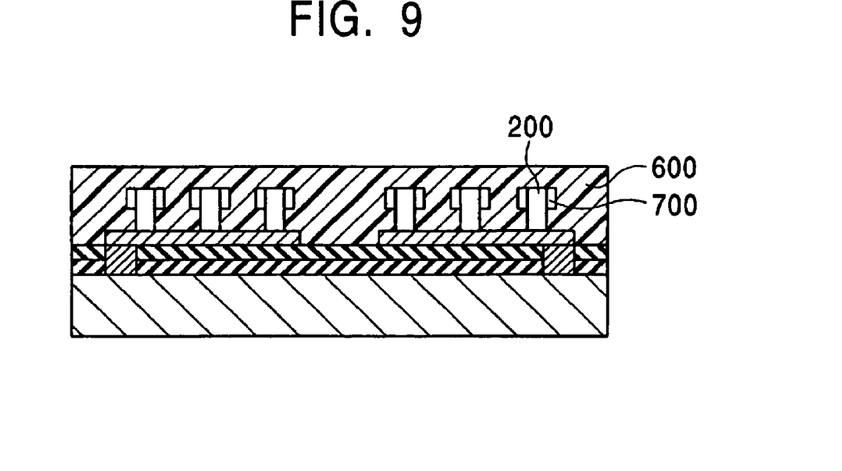
FIG. 9 is a cross-sectional view that shows the step of forming a sealing layer on the main surface of the semiconductor substrate, according to the second embodiment.

Next, as shown in FIG. 9, the sealing layer 600 that is made of an epoxy resin or the like is formed on the main surface of the semiconductor substrate 100 so as to cover the terminals 200 and the dummy layers 700.

Figure 10:
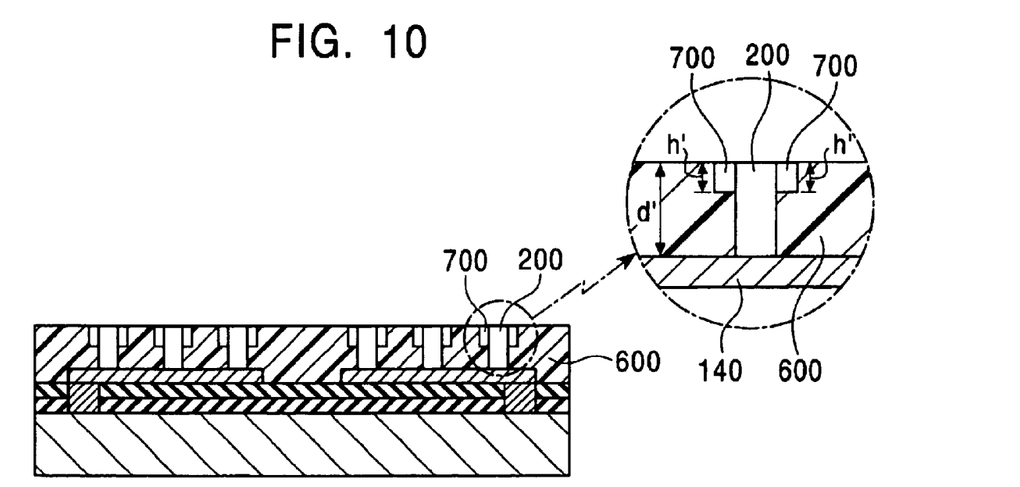
FIG. 10 is a cross-sectional view that shows the step of exposing the terminals and the dummy layers by polishing the surface of the sealing layer, according to the second embodiment.

Subsequently, as shown in FIG. 10, the top faces of the terminals 200 and the top faces of the dummy layers 700 are exposed by polishing the surface of the sealing layer 600.

The height d' of each polished terminal 200 is preferably at least 40 μm in order to reduce the effects of the stress generated as a result of the difference between the thermal expansion rate of the semiconductor substrate 100 and the thermal expansion rate of the external substrate. The dummy layer 700 is formed so that the height h' of the dummy layer 700 is at least 10 μm.

Figure 11:
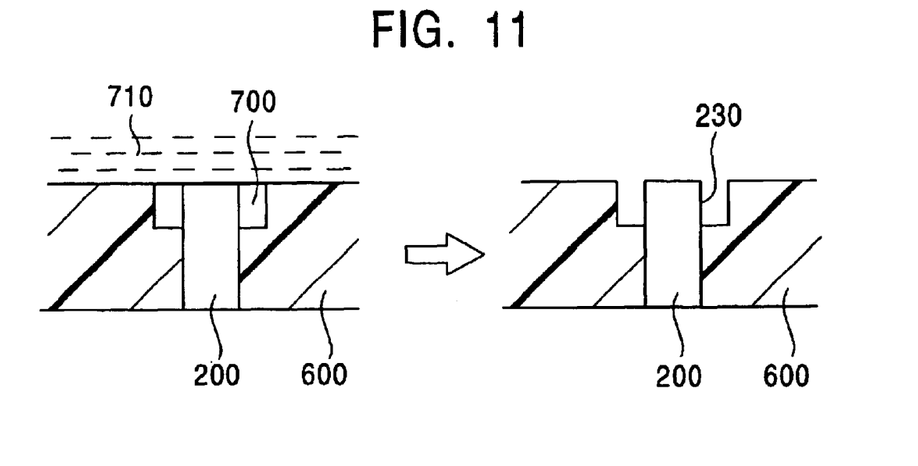
FIG. 11 is a cross-sectional view that shows the step of removing the dummy layers, according to the second embodiment.

Next, the sides 230 of the terminals 200 are exposed by removing the dummy layers 700 as shown in FIG. 11 which is an enlarged cross-sectional view of one of the terminals 200.

In this embodiment, the dummy layers 700 are removed by supplying a chemical 710, such as an organic solvent or alkaline solvent, to the dummy layers 700 to dissolve the dummy layers 700.

The supplying of the chemical 710 is performed by applying the chemical 710 to the main surface of the semiconductor device, that is, to the top face of the sealing layer 600 exposed by polishing and to the top faces of the dummy layers 700.

Because the dummy layer 700 is soluble in an organic solvent or an alkaline solvent or the like, this dummy layer 700 can be dissolved by means of the chemical 710. On the other hand, the sealing layer 600 is an epoxy resin that does not easily dissolve in an organic solvent or an alkaline solvent or the like, and hence the possibility of the sealing layer 600 being dissolved by the chemical 710 is low.

That is, because the condition for dissolving the dummy layer 700 and the condition for dissolving the sealing layer 600 are different, only the dummy layer 700 can be removed by using a certain chemical.

Accordingly, the respective sides of the terminals 200 can be simultaneously exposed, simply by means of the step of applying the chemical 710 to the main surface of the semiconductor device.

Figure 12:
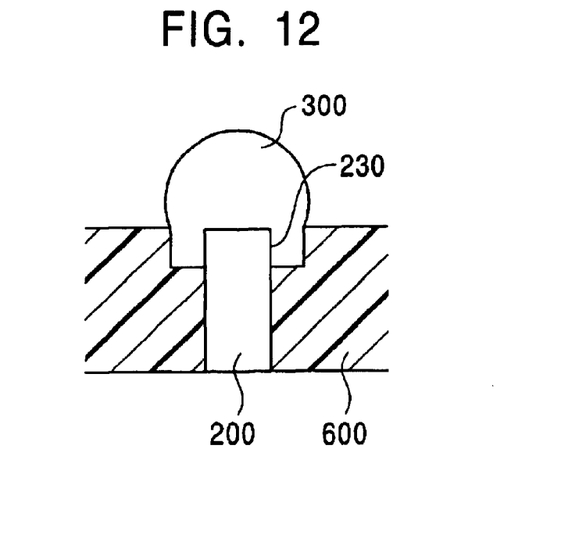
FIG. 12 is a cross-sectional view that shows the step of forming an external terminal on each of the terminals, according to the second embodiment.

Next, as shown in FIG. 12, which is an enlarged cross-sectional view of one of the terminals 200, the external terminal 300, which is made of a conductor, is formed on the surface of the each exposed terminal 200, that is, on the top face and side 230 of the terminal 200. In this embodiment, a solder ball is used for the external terminal 300.

The external terminal 300 is formed so as to connect and cover the top face and the side 230 of the associated terminal 200.

Accordingly, the stress acting on the external terminal 300 is dispersed not only to the join between the top face of the associated terminal 200 and the external terminal 300, but also to the join between the side 230 of that terminal 200 and the external terminal 300. Therefore, the possibility of a concentration of stress at the join between the top face of the terminal 200 and associated external terminal 300 and the occurrence of cracks and so forth at this join is reduced. Hence, the reliability of the connection between the semiconductor device and the external substrate can be increased.

In particular, the connection reliability (i.e., strength) is greatly improved when the stress from the transverse direction of the semiconductor device is concerned. This is because the external terminal 300 is formed so as to cover the side 230 of the associated terminal 200, and the external terminal 300 is suspended on the associated terminal 200 when the stress acts in the transverse direction of the semiconductor device.

If a semiconductor device is mounted in a portable device such as a cellular phone, stress often acts from the transverse direction of the semiconductor device due to the collisions and vibrations that occur when the portable device is carried around.

The adverse effects of this transverse stress can be reduced if the present embodiment is applied to such a semiconductor device. Thus, the present embodiment can improve the reliability of the connection between the semiconductor device and the external substrate, and improve the reliability of the semiconductor device.

As described above, in this embodiment, the dummy layers 700 are formed so as to cover the sides 230 of the terminals 200 before the sealing layer 600 is formed, and the sides 230 of the terminals 200 are exposed by removing the dummy layers 700 after the sealing layer 600 is formed.

Therefore, the step in which the sides 230 of the terminals 200 are exposed via the sealing layer by removing part of the sealing layer 600 by means of a laser is not performed. Without such step, the external terminal 300 can be formed on the top face and the side 230 of each terminal 200 in this embodiment. Thus, the production efficiency can be raised by shortening the package fabrication time.

Third Embodiment

Next, a third embodiment of the present invention will be described. The third embodiment is a modification to the semiconductor device fabrication methods of the first and second embodiments. Specifically, the third embodiment provides preferred control on the interval between the metal electrode 310 or dummy layer 700, and the main surface of the semiconductor substrate 100.

Figure 13:
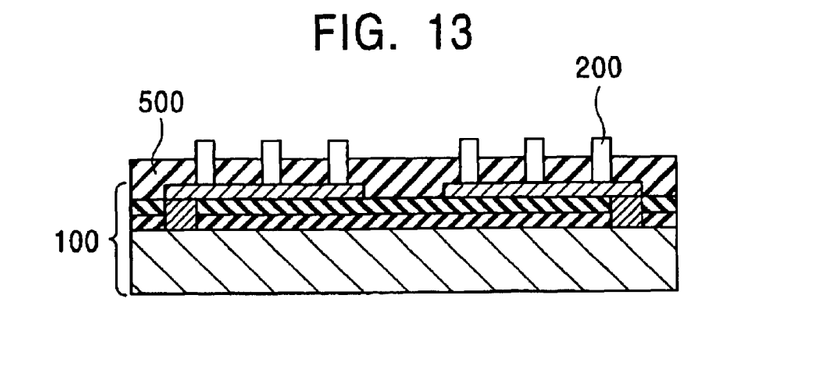
FIG. 13 is a cross-sectional view that shows the step of forming a first insulation film on the main surface of the semiconductor substrate, according to a third embodiment of the present invention.
Figure 14:
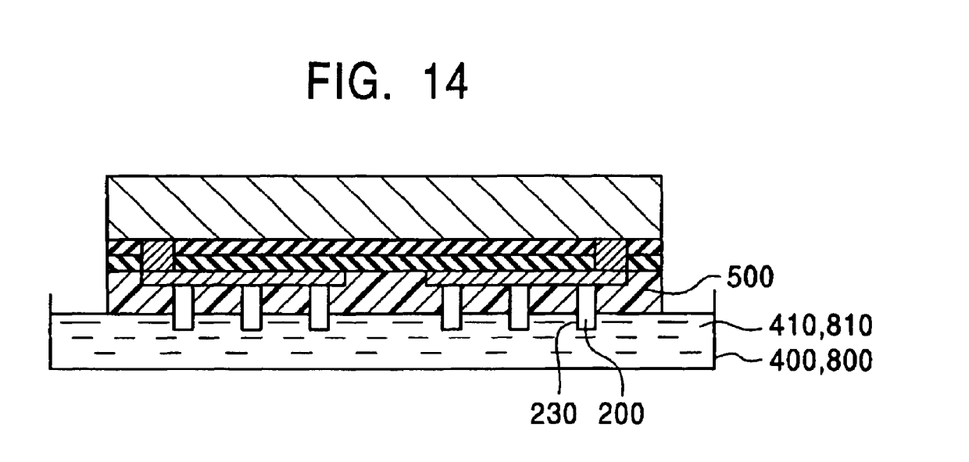
FIG. 14 is a cross-sectional view that shows the step of immersing the terminals in a metal bath or a resin bath, according to the third embodiment.
Figure 15:
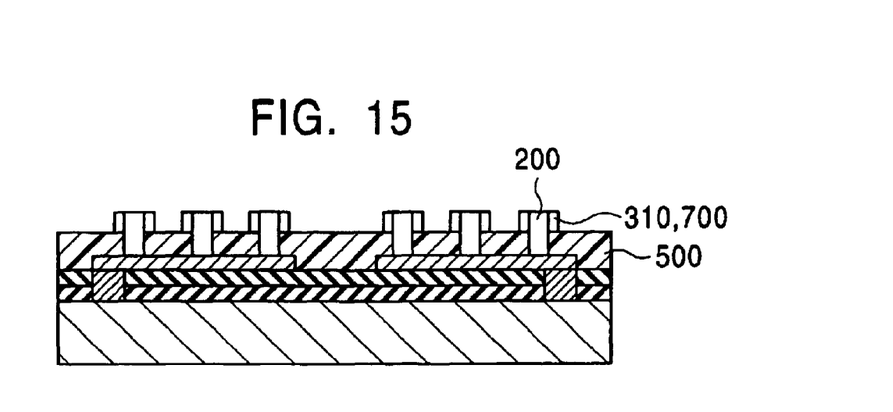
FIG. 15 is a cross-sectional view that shows the step of forming the first metal electrodes or the dummy layers on the terminals, according to the third embodiment.

FIGS. 13 to 15 are a series of cross-sectional views to explain how a semiconductor device is fabricated in this embodiment.

As shown in FIG. 13, in this embodiment, an insulation film 500 such as a solder resist is first formed by means of spin coating or a high accuracy printing method or similar on the main surface of the semiconductor substrate 100 such that the terminals 200 are exposed at a predetermined height.

Next, as shown in FIG. 14, the terminals 200 are immersed in the molten metal bath 400 or the molten resin bath 800. In this embodiment, the whole surface of the terminals 200 is immersed in the metal bath 400 or the resin bath 800.

Accordingly, as shown in FIG. 15, the metal electrodes 310 or dummy layers 700 are respectively formed on the sides 230 of the terminals 200 exposed via the insulation film 500.

When the terminals 200 are immersed in the metal bath 400 or in the resin bath 800, the main surface of the semiconductor substrate 100 is protected by the insulation film 500. There is therefore a reduced possibility of the molten metal 410 or resin 810 sticking to the main surface of the semiconductor substrate 100.

In addition, the interval between the main surface of the semiconductor substrate 100, and the metal electrode 310 or dummy layer 700 formed on the terminal 200, can be set at a desired distance by controlling the thickness of the insulation film 500. As mentioned in the first and second embodiments, the interval between the main surface of the semiconductor substrate 100, and the metal electrode 310 or dummy layer 700 is preferably 20 μm or more. Therefore, the insulation film 500 is formed with a film thickness at least 20 μm in the third embodiment.

Thereafter, the insulation film 500 is removed and the sealing layer 600 is formed on the main surface of the semiconductor substrate 100.

Figure 16:
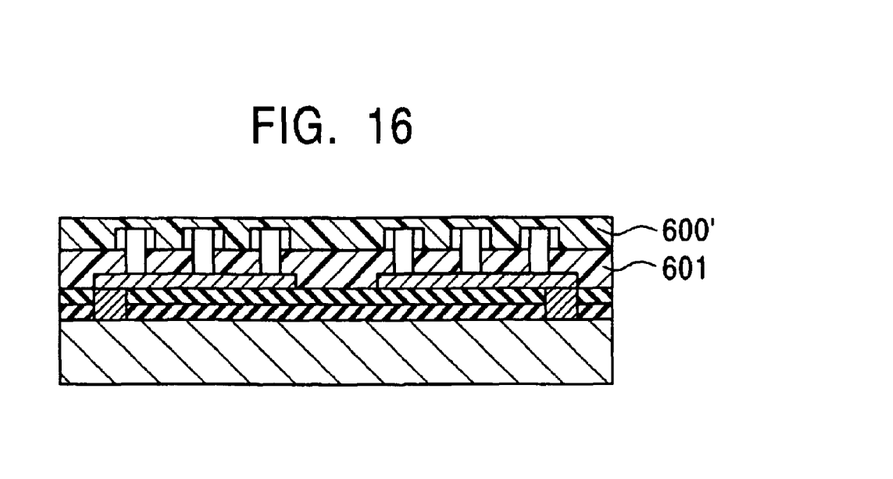
FIG. 16 is a cross-sectional view that shows the step of laminating sealing layers, according to a modified third embodiment.

It should be noted that a sealing layer 601 that is made of resin or similar may be used for the insulation film 500 in the third embodiment.

In this case, the sealing layer 601 is not removed. Rather, as shown in FIG. 16, a sealing layer 600' is formed on the top face of the sealing layer 601.

The material of the sealing layer 601 is a low elasticity resin (polyimide, for example) with a flexural modulus E of 0.5 to 4 GPa at normal temperature, and the material of the sealing layer 600' is a high elasticity resin (epoxy resin, for example) with a flexural modulus E of about 9 to 21 GPa at normal temperature.

Accordingly, the stresses acting on the terminals 200 can be more suitably absorbed by the sealing layer 601 and the sealing layer 600'.

This application is based on a Japanese Patent Application No. 2003-158380 and the entire disclosure thereof is incorporated herein by reference.

What is claimed is:

1. A semiconductor device fabrication method, comprising the steps of:
   A) preparing a semiconductor substrate having a plurality of terminals formed on a main surface of the semiconductor substrate;
   B) forming a first metal electrode on a side face of each said terminal;
   C) forming a sealing layer on the main surface of the semiconductor substrate so as to cover the terminals and the first metal electrodes;
   D) exposing a top face of each said terminal and a top face of each said first metal electrode by polishing a surface of the sealing layer;
   E) forming a second metal electrode on the exposed top face of each said terminal and on the exposed top face of each said first metal electrode; and
   F) producing an alloy of each said first metal electrode and associated said second metal electrode by heating the first and second metal electrodes.

2. The semiconductor device fabrication method according to claim 1, wherein each said first metal electrode is formed so as to surround the side face of each said terminal.

3. The semiconductor device fabrication method according to claim 1, wherein the respective top faces of the terminals and the first metal electrodes that are exposed by polishing the surface of the sealing layer are substantially planar to a top face of the polished sealing layer.

4. The semiconductor device fabrication method according to claim 1, wherein the step B includes the step G of immersing the terminals in a metal bath supplied with molten metal.

5. The semiconductor device fabrication method according to claim 4, wherein the step G includes immersing the terminals in the metal bath such that the main surface of the semiconductor substrate and a liquid surface of the metal bath face each other and are parallel to each other.

6. The semiconductor device fabrication method according to claim 4, wherein the terminals are immersed in the metal bath such that the main surface of the semiconductor substrate and the liquid surface of the metal bath are spaced apart by a predetermined interval.

7. The semiconductor device fabrication method according to claim 4, wherein the step B includes the steps of:
forming a first insulation film on the main surface of the semiconductor substrate such that each said terminal is exposed at a predetermined height; and
immersing said terminals exposed via the first insulation film in the metal bath.

8. The semiconductor device fabrication method according to claim 1, wherein a material of the first metal electrode is solder and a material of the second metal electrode is also solder.

9. The semiconductor device fabrication method according to claim 1, wherein each said second metal electrode is a ball-type electrode.

10. The semiconductor device fabrication method according to claim 1, wherein the semiconductor substrate includes:
   a semiconductor wafer having an integrated circuit formed on a main surface of the semiconductor wafer;
   a plurality of third electrodes formed on the semiconductor wafer;
   a second insulation film formed on the semiconductor wafer such that a top face of each said third electrode is exposed; and
   wiring formed on the second insulation film for electrically connecting the terminals to the third electrodes.

11. The semiconductor device fabrication method according to claim 1, wherein the terminals are made from copper, and the semiconductor device fabrication method further includes forming an oxide film by oxidizing the surface of each said terminal, before the step C.

12. The semiconductor device fabrication method according to claim 7, wherein the first insulation film has a lower modulus of elasticity than the sealing layer, and the sealing layer is formed on the first insulation film.

13. The semiconductor device fabrication method according to claim 12, wherein a material of the sealing layer is a high elasticity resin having a flexural modulus E of 9 to 21 GPa at normal temperature.

14. The semiconductor device fabrication method according to claim 12, wherein a material of the first insulation film is a low elasticity resin having a flexural modulus E of 0.5 to 4 GPa at normal temperature.

15. A semiconductor device fabrication method comprising the steps of:
   A) preparing a semiconductor substrate having a plurality of terminals formed on a main surface of the semiconductor substrate;
   B) covering a side face of each said terminal with a dummy layer;
   C) forming a sealing layer on the main surface of the semiconductor substrate so as to cover the terminals and the dummy layers;
   D) exposing a top face of each said terminal and a top face of each said dummy layer by polishing a surface of the sealing layer;
   E) exposing the side face of each said terminal by removing the dummy layer; and
   F) forming a conductor on the exposed surface of each said terminal.

16. The semiconductor device fabrication method according to claim 15, wherein the dummy layer is formed so as to surround the side face of each said terminal.

17. The semiconductor device fabrication method according to claim 15, wherein the step E includes dissolving the dummy layer by supplying a chemical to the dummy layer, in order to remove the dummy layer.

18. The semiconductor device fabrication method according to claim 15, wherein a material of the dummy layer is resin.

19. The semiconductor device fabrication method according to claim 18, wherein the step B includes the step G of immersing the terminals in a resin bath supplied with molten resin.

20. The semiconductor device fabrication method according to claim 19, wherein the step G includes immersing the terminals in the resin bath such that the main surface of the semiconductor substrate and a liquid surface of the resin bath face each other and are parallel to each other.

21. The semiconductor device fabrication method according to claim 19, wherein the step B includes:

forming a first insulation film on the main surface of the semiconductor substrate such that each said terminal is exposed at a predetermined height; and immersing the terminals exposed via the first insulation film in the resin bath.

22. The semiconductor device fabrication method according to claim 15, wherein the semiconductor substrate includes:

a semiconductor wafer having an integrated circuit formed on a main surface of the semiconductor wafer;

a plurality of electrodes formed on the semiconductor wafer;

a second insulation film formed on the semiconductor wafer such that a top face of each said electrode is exposed; and wiring formed on the second insulation film for electrically connecting the terminals to the electrodes.

23. The semiconductor device fabrication method according to claim 15, wherein a material of the terminals is copper, and the semiconductor device fabrication method further includes forming an oxide film by oxidizing the surface of each said terminal, before the step C.

24. The semiconductor device fabrication method according to claim 21, wherein the first insulation film has a lower modulus of elasticity than the sealing layer, and the sealing layer is formed on the first insulation film.

25. The semiconductor device fabrication method according to claim 24, wherein a material of the sealing layer is a high elasticity resin having a flexural modulus E of 9 to 21 GPa at normal temperature.

26. The semiconductor device fabrication method according to claim 24, wherein a material of the first insulation film is a low elasticity resin having a flexural modulus E of 0.5 to 4 GPa at normal temperature.

* * * * *